(12) United States Patent
Chou

(10) Patent No.: US 6,700,413 B1
(45) Date of Patent: Mar. 2, 2004

(54) SYMMETRIC CURRENT MODE LOGIC

(75) Inventor: Ming-Chung Chou, Kaohsiung (TW)

(73) Assignee: Industrial Technology Research Institute, Taipei Hsien (TW)

( * ) Notice: Subject to any disclaimer, the term of this patent is extended or adjusted under 35 U.S.C. 154(b) by 2 days.

(21) Appl. No.: 10/266,671

(22) Filed: Oct. 9, 2002

(30) Foreign Application Priority Data

Sep. 13, 2002 (TW) ........................................ 91121080 A

(51) Int. Cl.[7] ...................... H03K 19/20; H03K 19/086; H03K 19/21
(52) U.S. Cl. .............................. 326/127; 326/91; 326/52
(58) Field of Search ................................ 326/104, 115, 326/127, 85, 91, 52; 327/108, 109

(56) References Cited

U.S. PATENT DOCUMENTS 5,355,035 A * 10/1994 Vora et al. .................. 327/433
2002/0084806 A1 * 7/2002 Yang .......................... 326/127

* cited by examiner

*Primary Examiner*—Daniel Chang
(74) *Attorney, Agent, or Firm*—Bacon & Thomas, PLLC

(57) ABSTRACT

A symmetric current mode logic with symmetric input loads as well as identical input logic levels at the input terminals so as to prevent phase error due to level adjustment and to further avoid signal surges due to current steering by parallel switching.

10 Claims, 10 Drawing Sheets

SYMMETRIC CURRENT MODE LOGIC

BACKGROUND OF THE INVENTION

1. Field of the Invention

The present invention generally relates to a symmetric current mode logic and, more particularly, to a current mode logic with symmetric input loads at the input terminals so as to overcome the limitations due to the difference between the input loads or the level demands and to further avoid signal surges due to current steering.

2. Description of the Prior Art

In a conventional current mode logic, because of the difference between the input loads or the level demands, serious signal surges due to current steering may take place at the output terminals when the logic is in operation, resulting in malfunction of the whole circuit. The logic levels at the two input terminals of a conventional current mode logic are different for a certain number of logic functions and the input loads seen at the input terminals are also different. Therefore, considerable limitations on applications are inevitable.

Please refer to FIG. 1, which is a schematic circuit diagram showing conventional current mode XOR (exclusive OR) logic. Ah shown in FIG. 1, the logic circuit comprises two differential amplifiers, in which a first differential amplifier includes a first input terminal A and a second input terminal AB and a second differential amplifier includes a third input terminal B and a fourth input terminal BB. When the third input terminal B is at a logical "1" and the fourth input terminal BB is at a logical "0", a first transistor Q1 is ON and a fourth transistor Q4 is OFF. Meanwhile, a first output terminal OUT is determined by a third transistor Q3 and a second output terminal OUTB is determined by a fourth transistor Q4. On the contrary, when the third input terminal B is at a logical "0" and the fourth input terminal BB is at a logical "1", the first transistor Q1 is OFF and the fourth transistor Q4 is ON. Meanwhile, the first output terminal OUT is determined by a sixth transistor Q6 and the second output terminal OUTB is determined by a fifth transistor Q5. Therefore, the first output terminal OUT outputs the result after an XOR operation of the first input terminal A and the third input terminal B, while the second output terminal OUTB outputs the result after an XNOR operation of the first input terminal A and the third input terminal B.

In the aforementioned logic circuit, the logical level at the first input terminal A is based on the third input terminal B. In other words, the logical level required for the first input terminal A is different from the logical level required for the third input terminal B. Therefore, two current steering cases may occur in such a dual-level current mode logic, in which an alternation of the first transistor Q1 and the fourth transistor Q4 follows the alternation of the second transistor Q2 and the third transistor Q3 or the alternation of the fifth transistor Q5 and the sixth transistor Q6. Meanwhile, current steering resulting from the alternation of these transistors leads to serious signal surges at the output terminals. During the operation of the logic circuit, serious signal surges may take place due to stack CML current steering when the two transistors are ON simultaneously. For example, when the logic level at the first input terminal A and the logic level at the third input terminal B are both turned into a logical "1" from a logical "0", the XOR of the first input terminal A and the third input terminal B (A XOR B) should remain as a logical "0", i.e., OUT=(A·BB)+(AB·B). In short, both the first output terminal OUT and the second output terminal OUTB are kept as a logical "0". However, signal surges may happen because of current steering.

Even though current steering is inevitable when the current mode logic is in operation, serious signal surges may, however, be avoided by using a single-level logic circuit configuration instead of a dual-level logic circuit configuration so as to prevent stack current steering. In the prior art, the input load seen at the first input terminal A and the input load seen at the third input terminal B of the current mode logic are different. Moreover, the logic level at the second input terminal AB and the logic level at the fourth input terminal BB are different such that both of the first transistor Q1 and the fourth transistor Q4 operate in an active region. All these limit the applications of the conventional XOR logic circuits.

Therefore, there is need for providing a symmetric current mode logic employing a single-level logic with parallel switching so as to overcome serious signal surges resulting from stack current steering. Furthermore, the logic levels and the input loads at respective input terminals are identical by virtue of the single-level logic.

SUMMARY OF THE INVENTION

It is the primary object of the present invention to provide a symmetric current mode logic with symmetric input loads as well as identical input logic levels at the input terminals so as to prevent phase error due to level adjustment and to further avoid signal surges due to current steering by parallel switching.

In order to achieve the foregoing object, the present invention provides a symmetric current mode logic, comprising: an output circuit comprising a plurality of input terminals and two differential amplifiers sharing a pair of output terminals being a first output terminal and a second output terminal; and a plurality of input circuits functioning as a plurality of symmetric current mode logic units, each comprising a plurality of signal output terminals connected to said plurality of input terminals of said output circuit so as to form a single-level logic circuit.

Other and further features, advantages and benefits of the invention will become apparent in the following description taken in conjunction with the following drawings. It is to be understood that the foregoing general description and following detailed description are exemplary and explanatory but are not to be restrictive of the invention. The accompanying drawings are incorporated in and constitute a part of this application and, together with the description, serve to explain the principles of the invention in general terms. Like numerals refer to like parts throughout the disclosure.

BRIEF DESCRIPTION OF THE DRAWINGS

The objects, spirits and advantages of the preferred embodiments of the present invention will be readily understood by the accompanying drawings and detailed descriptions, wherein.

DETAILED DESCRIPTION OF THE INVENTION

The present invention providing a symmetric current mode logic can be exemplified by the preferred embodiments as described hereinafter.

Figure 1:
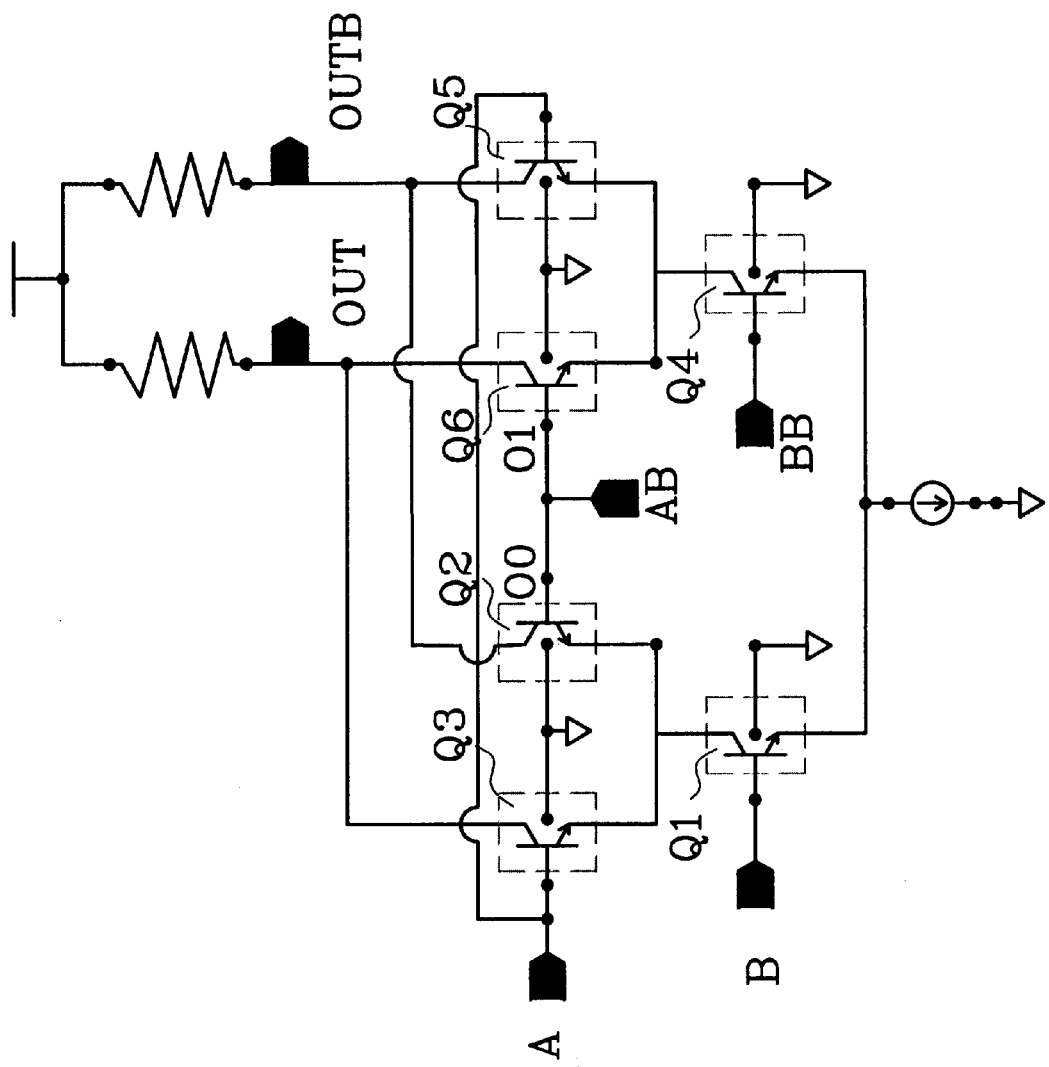
FIG. 1 is a schematic circuit diagram showing a conventional current mode XOR logic in the prior art.
Figure 2:
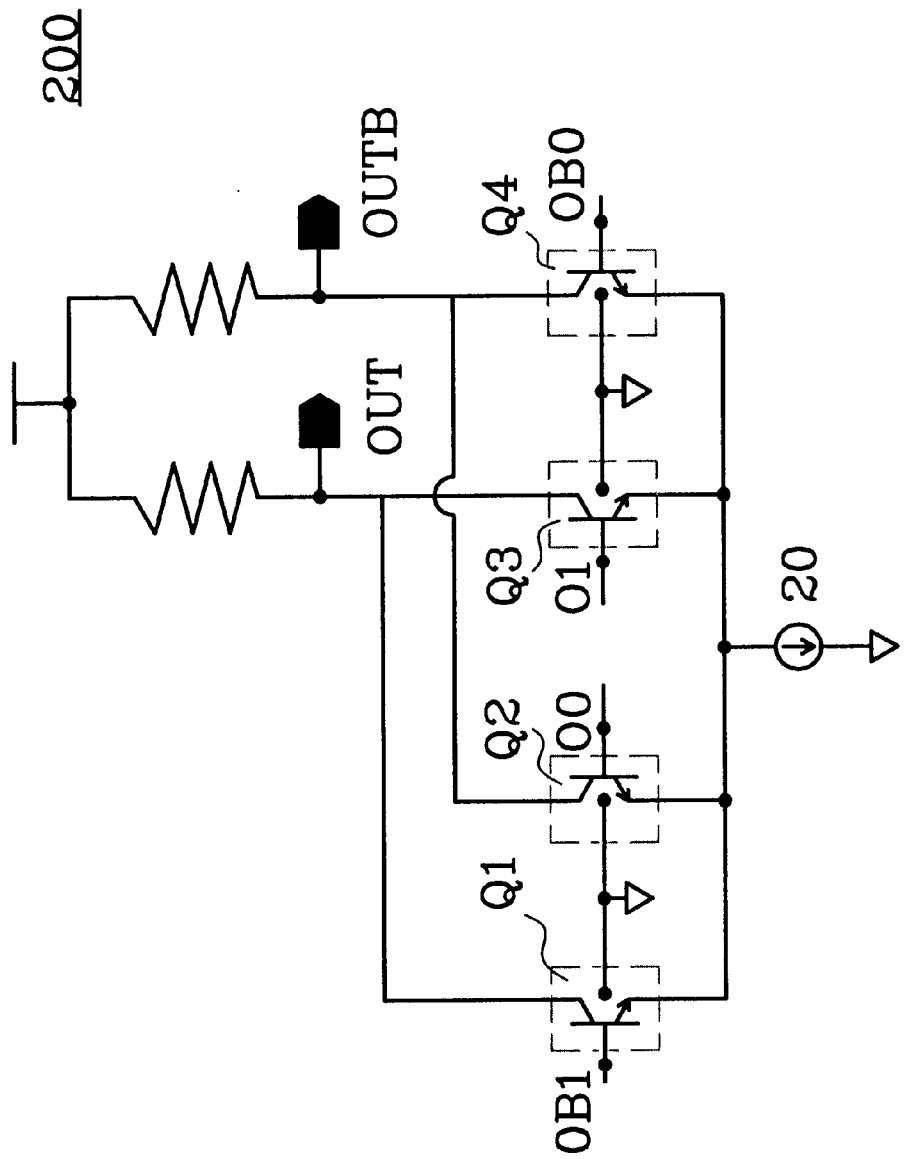
FIG. 2 is a schematic circuit diagram showing an output circuit in accordance with the present invention.

To start with, please refer to FIG. 2, which is a schematic circuit diagram showing an output circuit in accordance with the present invention. In FIG. 2, the output circuit 200 comprises two symmetric differential amplifiers, in which a first differential amplifier includes an input differential pair composed of a first transistor Q21 and a second transistor Q22 and a second differential amplifier includes an input differential pair composed of a third transistor Q23 and a fourth transistor Q24, sharing a current source 20. The output circuit 200 comprises further comprises a first input terminal OB1, a second input terminal O0, a third input terminal O1 and a fourth input terminal OB0 for four input circuits. The input circuits input logic levels via the four input terminals OB1, O0, O1 and OB0 so as to achieve a symmetric current mode logic according to the present invention. When the third transistor Q23 and the fourth transistor Q24 are OFF, a first output terminal OUT is determined by the first transistor Q21 and a second output terminal OUTB is determined by the second transistor Q22. On the contrary, when the first transistor Q21 and the second transistor Q22 are OFF, the first output terminal OUT is determined by the third transistor Q23 and the second output terminal OUTB is determined by the fourth transistor Q24. In the present invention, only one transistor is turned on while the other three transistors are turned off.

Figure 3A:
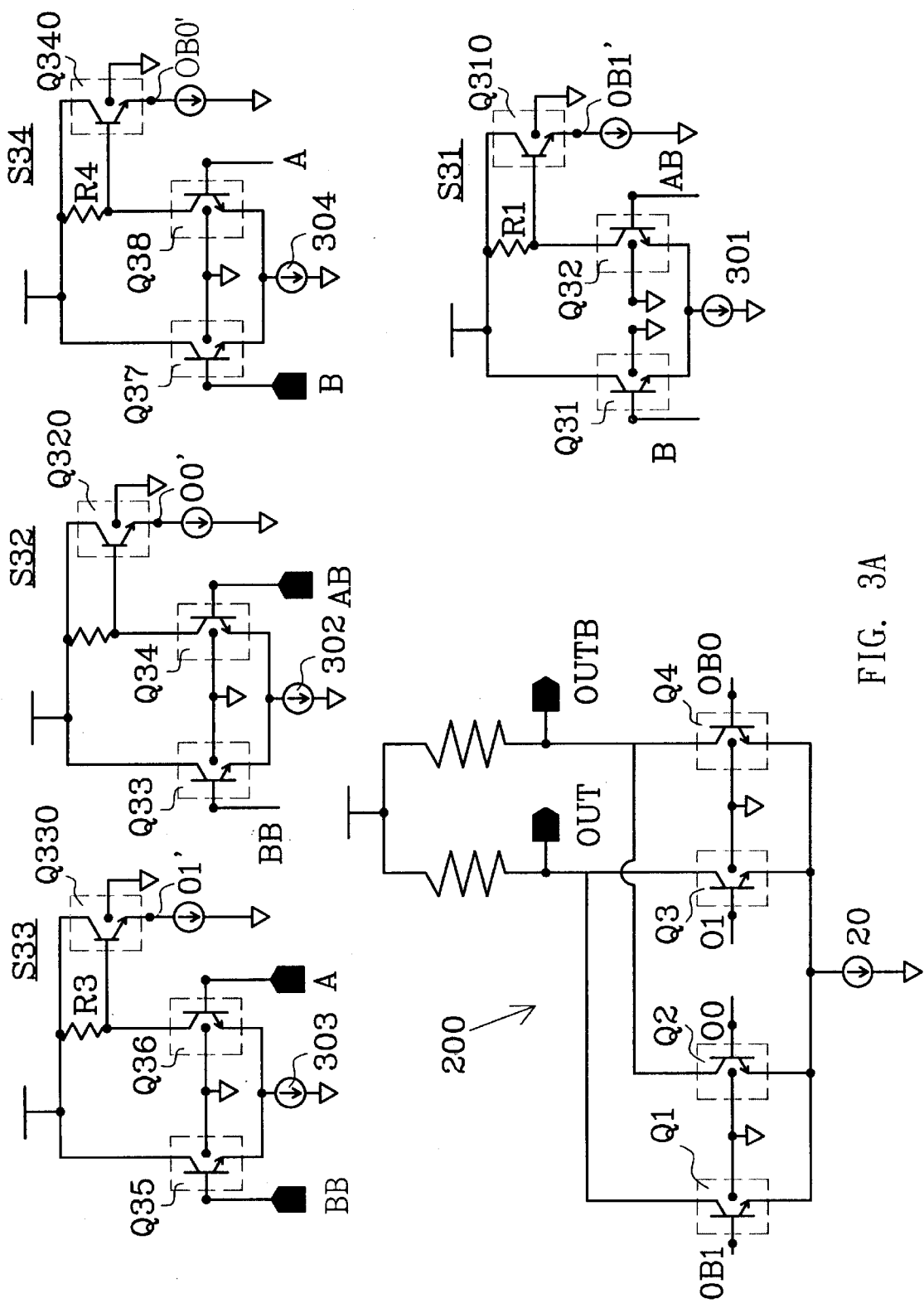
FIG. 3A is a schematic circuit diagram showing a current mode XOR logic comprising an output circuit and a plurality of input circuits in accordance with one preferred embodiment of the present invention.

Please refer to FIG. 3A, which is a schematic circuit diagram showing a current mode XOR logic in accordance with one preferred embodiment of the present invention. For the output circuit 200 (identical to the output circuit 200 in FIG. 2), the first input terminal OB1 is connected to a first signal output terminal OB1' of a first stage input circuit S31, the second input terminal O0 is connected to a second signal output terminal O0' of a second stage input circuit S32, the third input terminal O1 is connected to a third signal output terminal O1' of a third stage input circuit S33, and the fourth input terminal OB0 is connected to a fourth signal output terminal OB0' of a fourth stage input circuit S34. Each of the four input circuits is a symmetric current mode logic unit comprising a differential pair of transistors so as to achieve XOR operation of a symmetric current mode logic by using various ways of circuitry connection.

In the first stage input circuit S31, a differential pair comprises a first transistor Q31 and a second transistor Q32 that share a first current source 301 and are connected to a base of a first stage output transistor S310. When the signal input terminal B of the first stage input circuit S31 is at a logical "1" and the signal input terminal AB is at a logical "1", an half of the current from the first current source 301 flows through the first transistor Q31 and another half of the current flows through the second transistor Q32. Meanwhile, the signal at the first signal output terminal OB1' of the first stage input circuit S31 is at a middle logic level, at neither a logical "0" nor a logical "1".

In the second stage input circuit S32, a differential pair comprises a first transistor Q33 and a second transistor Q34 that share a second current source 302 and are connected to a base of a second stage output transistor S320. When the signal input terminal BB of the second stage input circuit S32 is at a logical "0" and the signal input terminal AB is at a logical "1", the first transistor Q33 is OFF and all the current from the second current source 302 flows through the second transistor Q34. Meanwhile, the signal at the second signal output terminal O0' of the second stage input circuit S32 is at a logical "0".

In the third stage input circuit S33, a differential pair comprises a first transistor Q35 and a second transistor Q36 that share a third current source 303 and are connected to a base of a third stage output transistor S330. When the signal input terminal BB of the third stage input circuit S33 is at a logical "0" and the signal input terminal A is at a logical "0", an half of the current from the third current source 303 flows through the first transistor Q35 and another half of the current flows through the second transistor Q36. Meanwhile, the signal at the third signal output terminal O1' of the third stage input circuit S33 is at a middle logic level, at neither a logical "0" nor a logical "1".

In the fourth stage input circuit S34, a differential pair comprises a first transistor Q37 and a second transistor Q38 that share a fourth current source 304 and are connected to a base of a fourth stage output transistor S340. When the signal input terminal B of the fourth stage input circuit S34 is at a logical "1" and the signal input terminal A is at a logical "0", all the current from the fourth current source 304 flows through the first transistor Q37. Meanwhile, the signal at the fourth signal output terminal OB0' of the fourth stage input circuit S34 is at a logical "1".

Therefore, in the preferred embodiment of the present invention, only one of the first transistor Q21, the second transistor Q22, the third transistor Q23, and the fourth transistor Q21 in the output circuit is ON. More particularly, the transistor having a highest voltage at the base is ON, while the other three transistors are OFF. Therefore, the middle logic level in the input circuit is regarded as a logical "0".

Figure 3B:
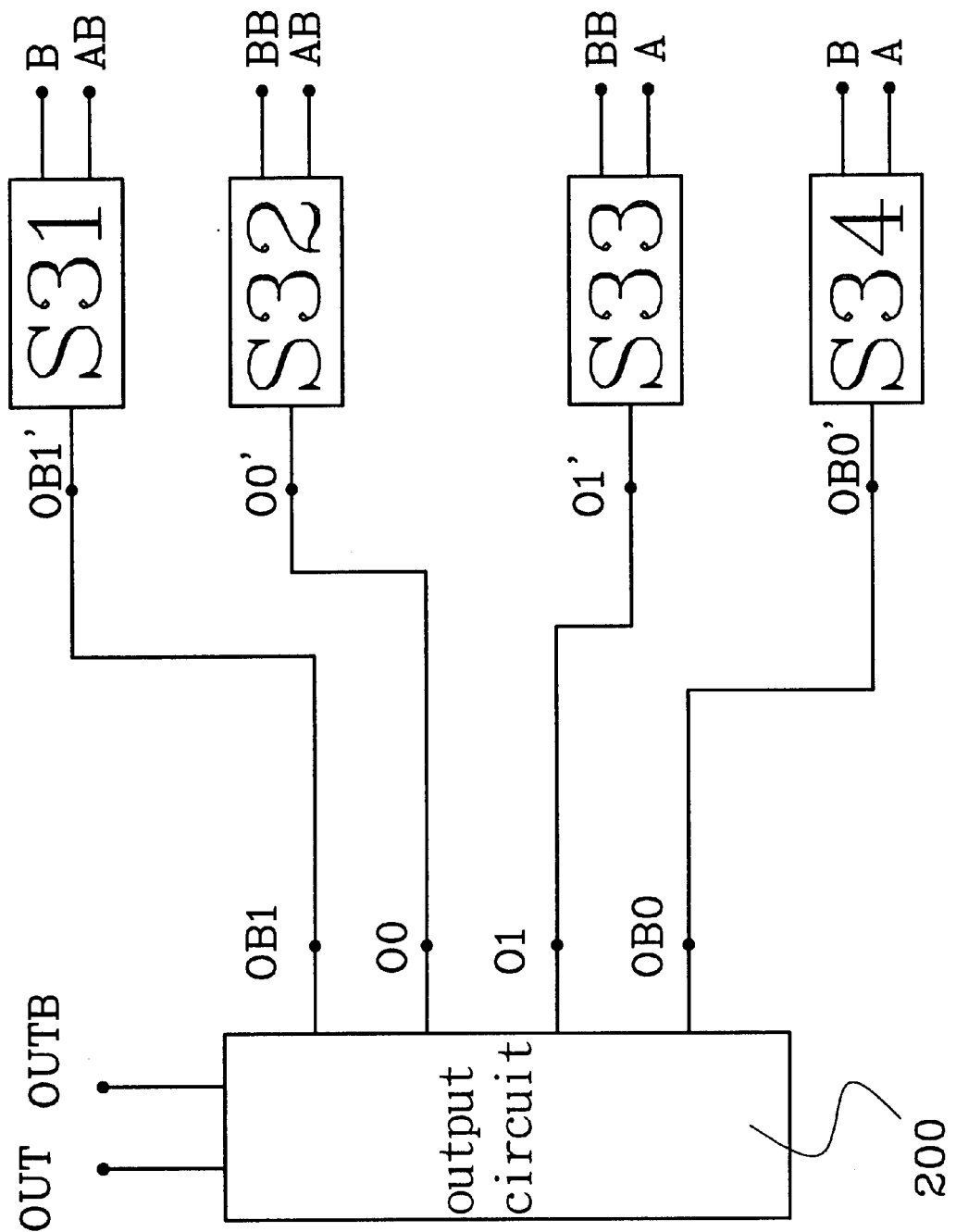
FIG. 3B is a schematic block diagram showing a current mode XOR logic with the input circuits connected to the output circuit in accordance with one preferred embodiment of the present invention.

Please also refer to FIG. 3B; which is a schematic block diagram showing a current mode XOR logic with the input circuits connected to the output circuit in accordance with one preferred embodiment of the present invention. As shown in FIG. 3B, the first input terminal OB1 of the output circuit 200 is connected to the first signal output terminal OB1' of the first stage input circuit S31. The first stage input circuit S31 further comprises a signal input terminal B and a signal input terminal AB. The second input terminal O0 of the output circuit 200 is connected to the second signal output terminal O0' of the second stage input circuit S32. The second stage input circuit S32 further comprises a signal input terminal BB and a signal input terminal AB. The third input terminal O1 of the output circuit 200 is connected to the third signal output terminal O1' of the third stage input circuit S33. The third stage input circuit S33 further comprises a signal input terminal BB and a signal input terminal A. The fourth input terminal OB0 of the output circuit 200 is connected to the fourth signal output terminal OB0' of the fourth stage input circuit S34. The fourth stage input circuit S34 further comprises a signal input terminal B and a signal input terminal A. In the XOR logic, the logic level at the second input terminal O0 is the product of the logic level at the input terminal A and the logic level at the input terminal BB, and the logic level at the fourth input terminal OB0 is the product of the logic level at the input terminal AB and the logic level at the input terminal B. Therefore, by connecting the four input circuits to the output circuit 200 is formed an XOR logic, outputting at the first output terminal a logic level OUT as a function of the sum of the logic level at the second input terminal O0 and the logic level at the fourth input terminal OB0, i.e., OUT=(A·BB)+(AB, B). Furthermore, the input logic levels and the input loads seen at the first stage input circuit S31, the second stage input circuit S32, the third stage input circuit S33 and the fourth stage input circuit S34 are identical.

Figure 4A:
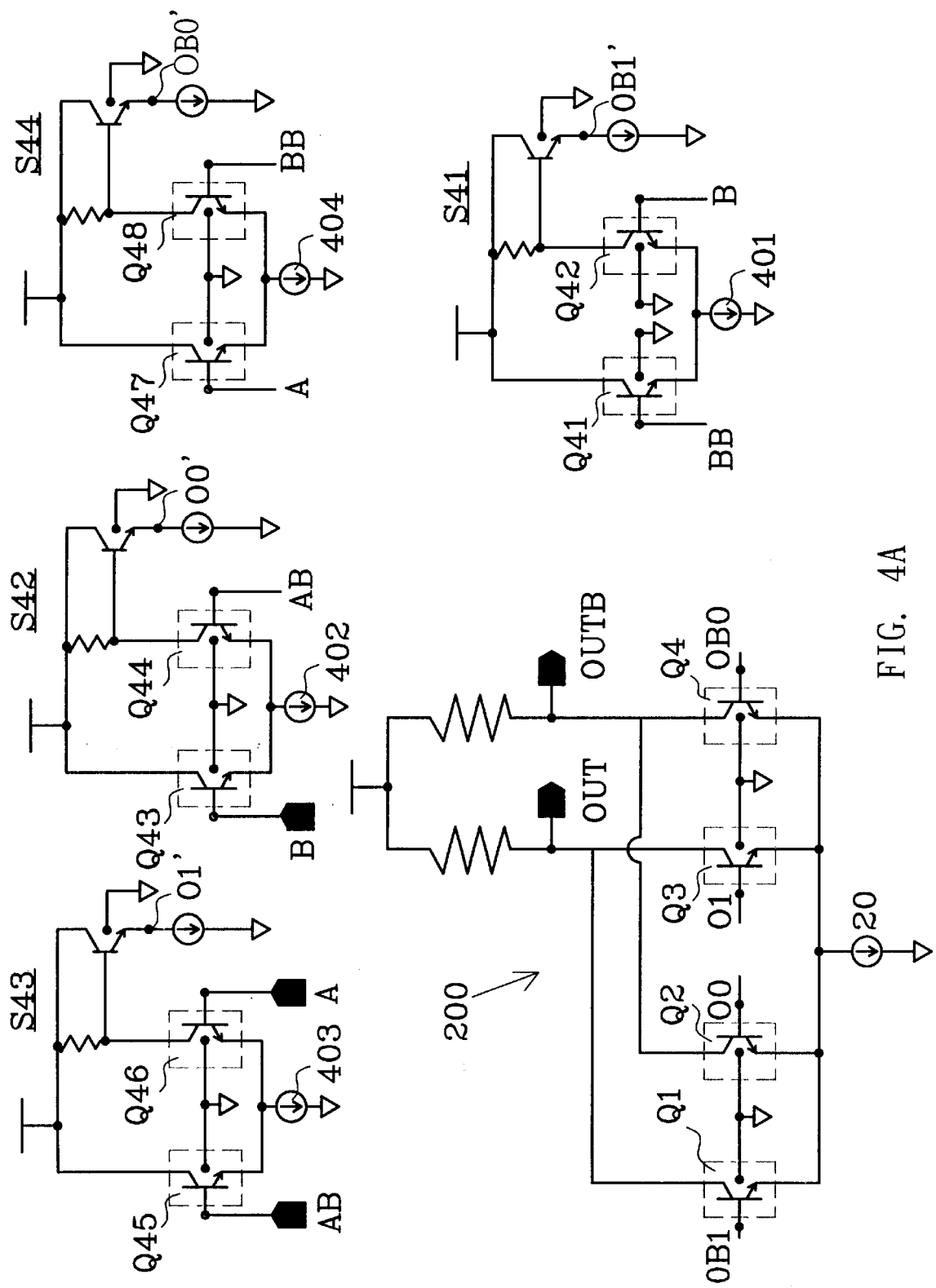
FIG. 4A is a schematic circuit diagram showing a current mode AND logic comprising an output circuit and a plurality of input circuits in accordance with another embodiment of the present invention.

Moreover, please refer to FIG. 4A, which is a schematic circuit diagram showing a current mode AND logic comprising an output circuit and a plurality of input circuits in accordance with another embodiment of the present invention. For the output circuit 200, the first input terminal OB1 is connected to the first signal output terminal OB1' of the first stage input circuit S41, the second input terminal O0 is connected to the second signal output terminal O0' of the second stage input circuit S42, the third input terminal O1 is connected to the third signal output terminal O1' of the third stage input circuit S43, and the fourth input terminal OB0 is connected to the fourth signal output terminal OB0' of the fourth stage input circuit S44. Each of the four input circuits is a symmetric current mode logic unit comprising a differential pair of transistors so as to achieve AND operation of a symmetric current mode logic by using various ways of circuitry connection. One example is as shown in FIG. 4B.

Figure 4B:
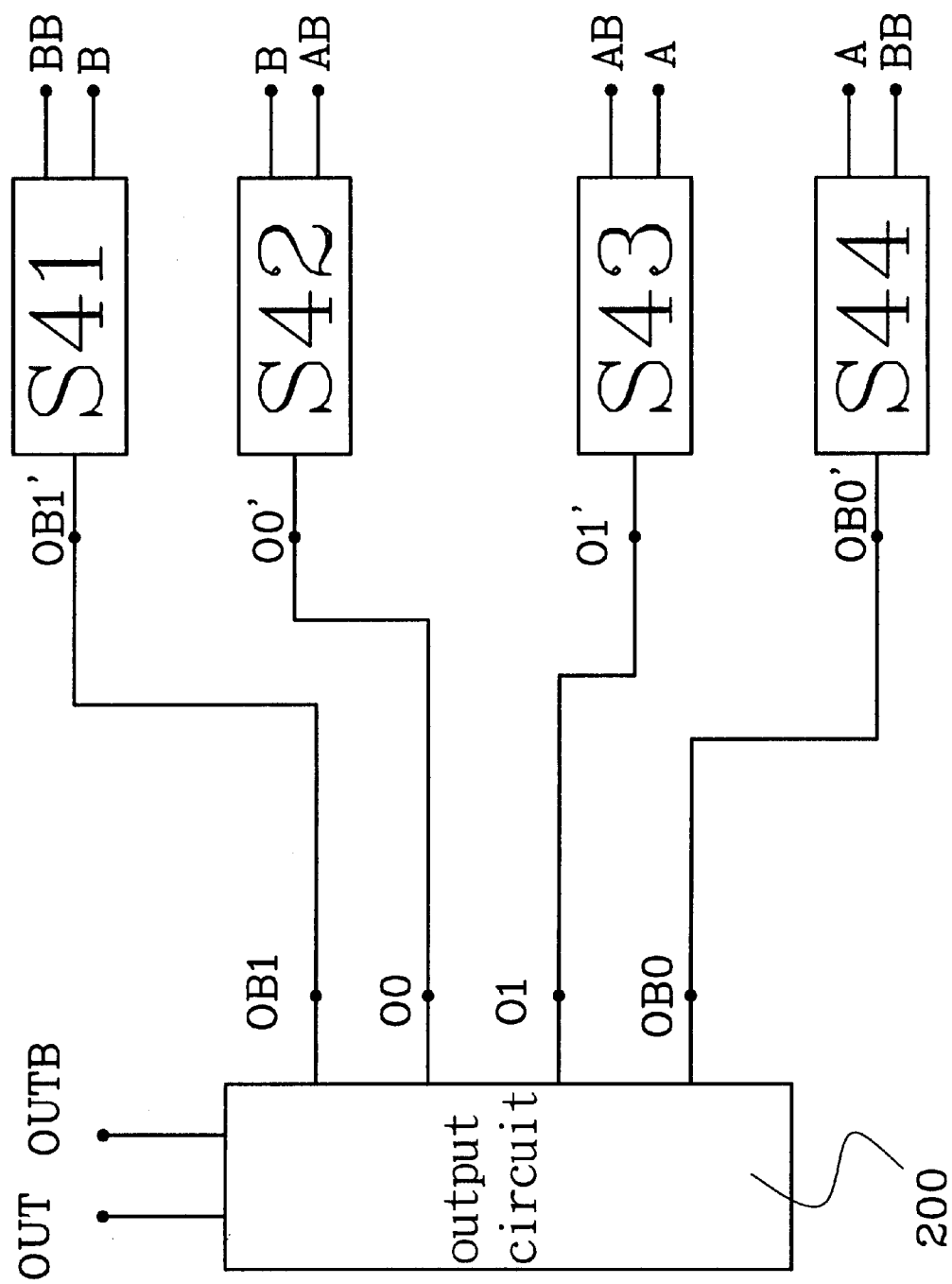
FIG. 4B is a schematic block diagram showing a current mode AND logic with the input circuits connected to the output circuit in accordance with another embodiment of the present invention.

Please refer to FIG. 4B, which is a schematic block diagram showing a current mode AND logic with the input circuits connected to the output circuit in accordance with another embodiment of the present invention. As shown in FIG. 4B, the first input terminal OB1 of the output circuit 200 is connected to the first signal output terminal OB1' of the first stage input circuit S41. The first stage input circuit S41 further comprises a signal input terminal BB and a signal input terminal B. The second input terminal O0 of the output circuit 200 is connected to the second signal output terminal O0' of the second stage input circuit S42. The second stage input circuit S42 further comprises a signal input terminal B and a signal input terminal AB. The third input terminal O1 of the output circuit 200 is connected to the third signal output terminal O1' of the third stage input circuit S43. The third stage input circuit S43 further comprises a signal input terminal AB and a signal input terminal A. The fourth input terminal OB0 of the output circuit 200 is connected to the fourth signal output terminal OB0' of the fourth stage input circuit S44. The fourth stage input circuit S44 further comprises a signal input terminal A and a signal input terminal BB. Therefore, by connecting the four input circuits to the output circuit 200 is formed an AND logic, outputting at the first output terminal a logic level OUT as a function of the sum of the product of the logic level at the input terminal A and the logic level at the input terminal B and the product of the logic level at the input terminal A and the logic level at the input terminal B, i.e., OUT=A·B+A·B= A·B. Furthermore, the input logic levels and the input loads seen at the first stage input circuit S41, the second stage input circuit S42, the third stage input circuit S43 and the fourth stage input circuit S44 are identical.

Figure 5A:
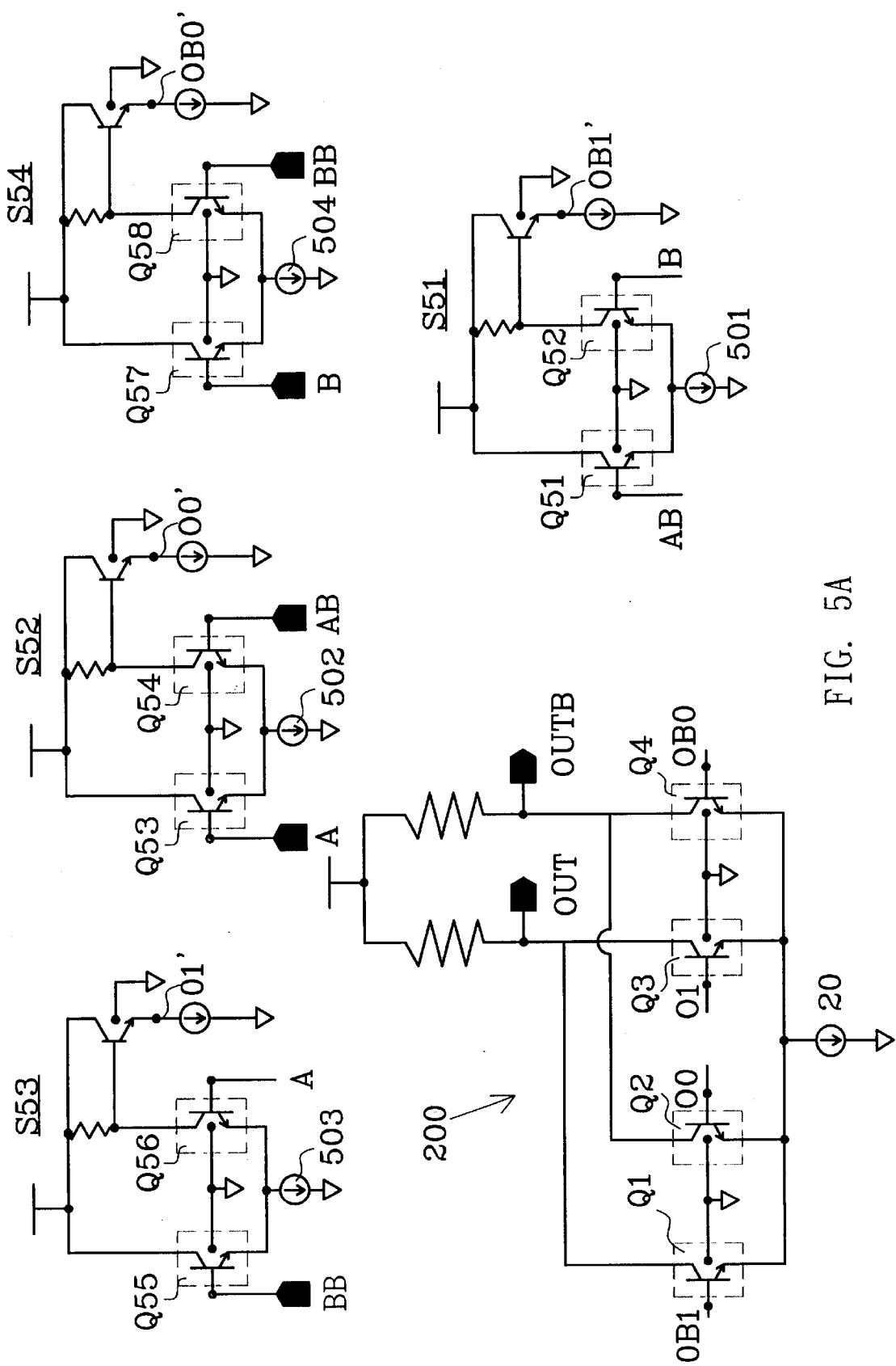
FIG. 5A is a schematic circuit diagram showing a current mode OR logic comprising an output circuit and a plurality of input circuits in accordance with still another embodiment of the present invention.

Furthermore, please refer to FIG. 5A, which is a schematic circuit diagram showing a current mode OR logic comprising an output circuit and a plurality of input circuits in accordance with still another embodiment of the present invention. For the output circuit 200, the first input terminal OB1 is connected to the first signal output terminal OB1' of the first stage input circuit S51, the second input terminal O0 is connected to the second signal output terminal O0' of the second stage input circuit S52, the third input terminal O1 is connected to the third signal output terminal O1' of the third stage input circuit S53, and the fourth input terminal OB0 is connected to the fourth signal output terminal OB0' of the fourth stage input circuit S54. Each of the four input circuits is a symmetric current mode logic unit comprising a differential pair of transistors so as to achieve OR operation of a symmetric current mode logic by using various ways of circuitry connection. One example is as shown in FIG. 5B.

Figure 5B:
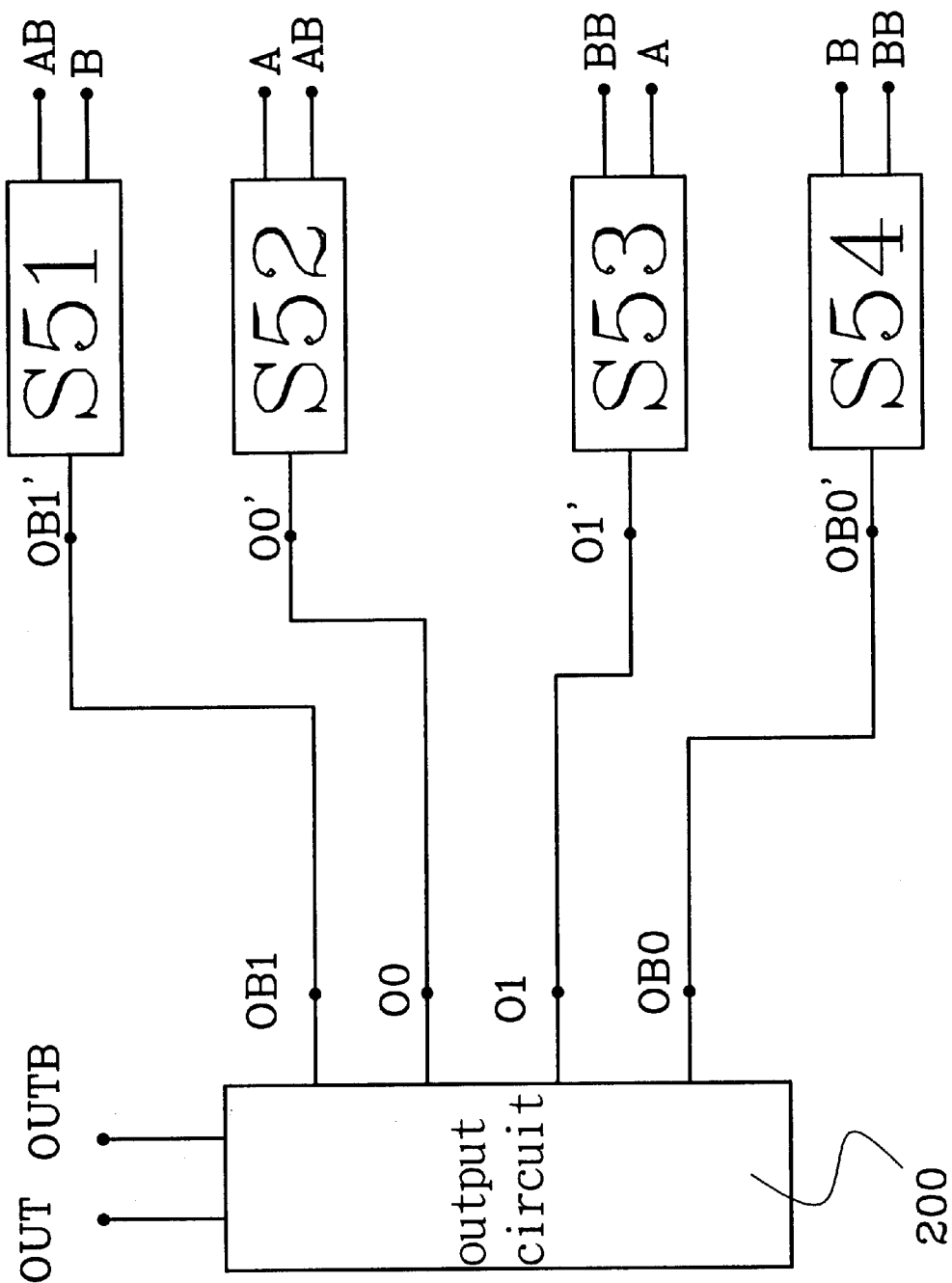
FIG. 5B is a schematic block diagram showing a current mode OR logic with the input circuits connected to the output circuit in accordance with still another embodiment of the present invention.

Also refer to FIG. 5B, which is a schematic block diagram showing a current mode OR logic with the input circuits connected to the output circuit in accordance with still another embodiment of the present invention. As shown in FIG. 5B, the first input terminal OB1 of the output circuit 200 is connected to the first signal output terminal OB1' of the first stage input circuit S51. The first stage input circuit S51 further comprises a signal input terminal AB and a signal input terminal B. The second input terminal O0 of the output circuit 200 is connected to the second signal output terminal O0' of the second stage input circuit S52. The second stage input circuit S52 further comprises a signal input terminal A and a signal input terminal AB. The third input terminal O1 of the output circuit 200 is connected to the third signal output terminal O1' of the third stage input circuit S53. The third stage input circuit S53 further comprises a signal input terminal BB and a signal input terminal A. The fourth input terminal OB0 of the output circuit 200 is connected to the fourth signal output terminal OB0' of the fourth stage input circuit S54. The fourth stage input circuit S54 further comprises a signal input terminal B and a signal input is terminal BB. Therefore, by connecting the four input circuits to the output circuit 200 is formed an OR logic, outputting at the first output terminal a logic level OUT as a function of the sum of the product of the logic level at the input terminal A and the logic level at the input terminal A and the product of the logic level at the input terminal B and the logic level at the input terminal B, i.e., OUT=A·A+B·B= A+B. Furthermore, the input logic levels and the input loads seen at the first stage input circuit S51, the second stage input circuit S52, the third stage input circuit S53 and the fourth stage input circuit S54 are identical.

Figure 6A:
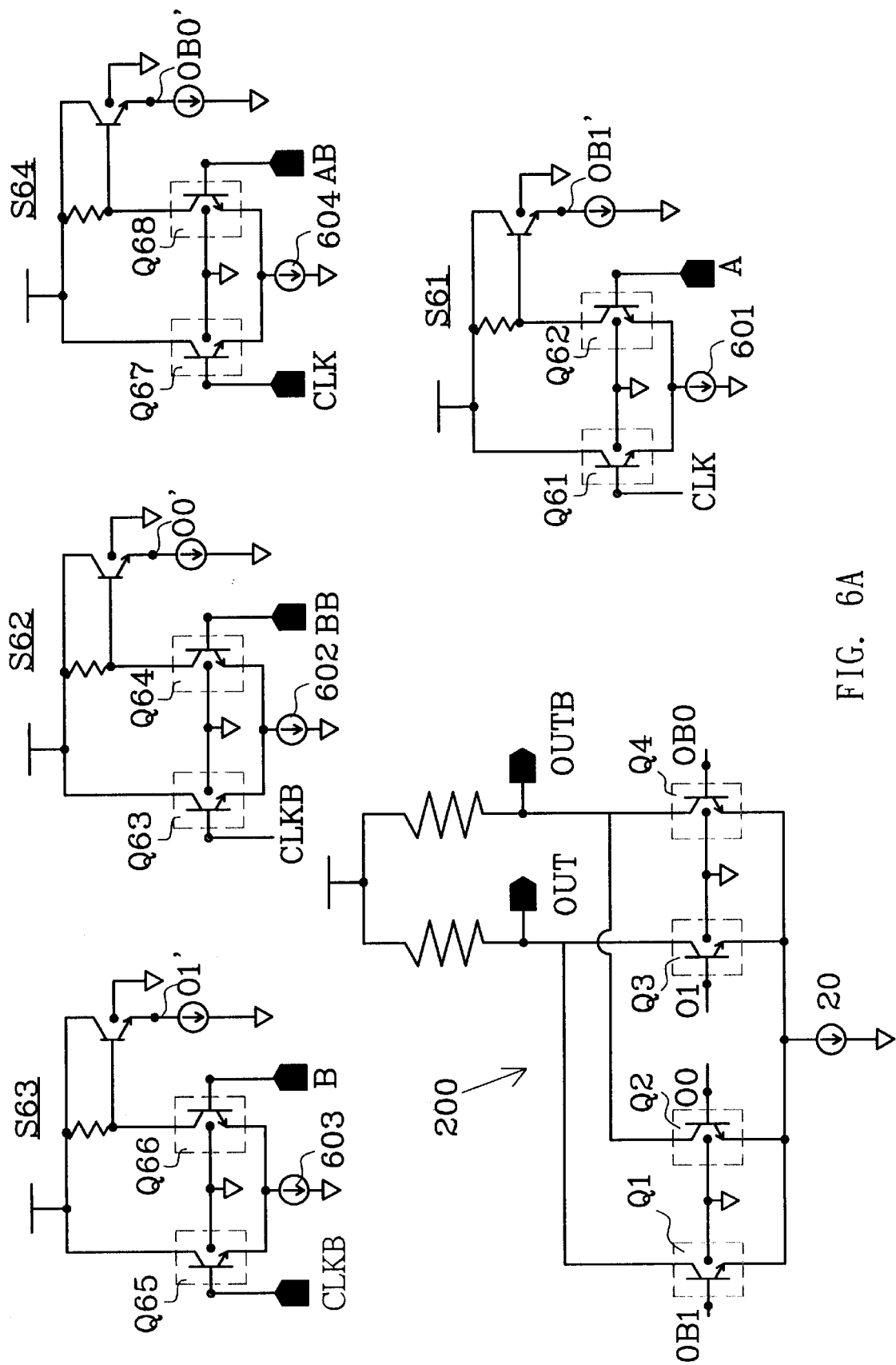
FIG. 6A is a schematic circuit diagram showing a multiplier comprising an output circuit and a plurality of input circuits in accordance with yet another embodiment of the present invention.

Furthermore, please refer to FIG. 6A, which is a schematic circuit diagram showing a multiplier comprising an output circuit and a plurality of input circuits in accordance with yet another embodiment of the present invention. For the output circuit 200, the first input terminal OB1 is connected to the first signal output terminal OB1' of the first stage input circuit S61, the second input terminal O0 is connected to the second signal output terminal O0' of the second stage input circuit S62, the third input terminal O1 is connected to the third signal output terminal O1' of the third stage input circuit S63, and the fourth input terminal OB0 is connected to the fourth signal output terminal OB0' of the fourth stage input circuit S64. Each of the four input circuits is a symmetric current mode logic unit comprising a differential pair of transistors. The gate of a first transistor Q61 in the first stage input circuit S61 is a first clock input terminal CLK, while the gate of a second transistor Q62 in the first stage input circuit S61 is a signal input terminal AB. The gate of a first transistor Q63 in the second stage input circuit S62 is a second clock input terminal CLKB, while the gate of a second transistor Q64 in the second stage input circuit S62 is a signal input terminal BB. The gate of a first transistor Q65 in the third stage input circuit S63 is a second clock input terminal CLKB, while the gate of a second transistor Q66 in the third stage input circuit S63 is a signal input terminal B. The gate of a first transistor Q67 in the four stage input circuit S64 is a first clock input terminal CLK, while the gate of a second transistor Q68 in the third stage input circuit S64 is a signal input terminal A. A multiplexer by using various ways of circuitry connection can thus be formed. One example is as shown in FIG. 6B.

Figure 6B:
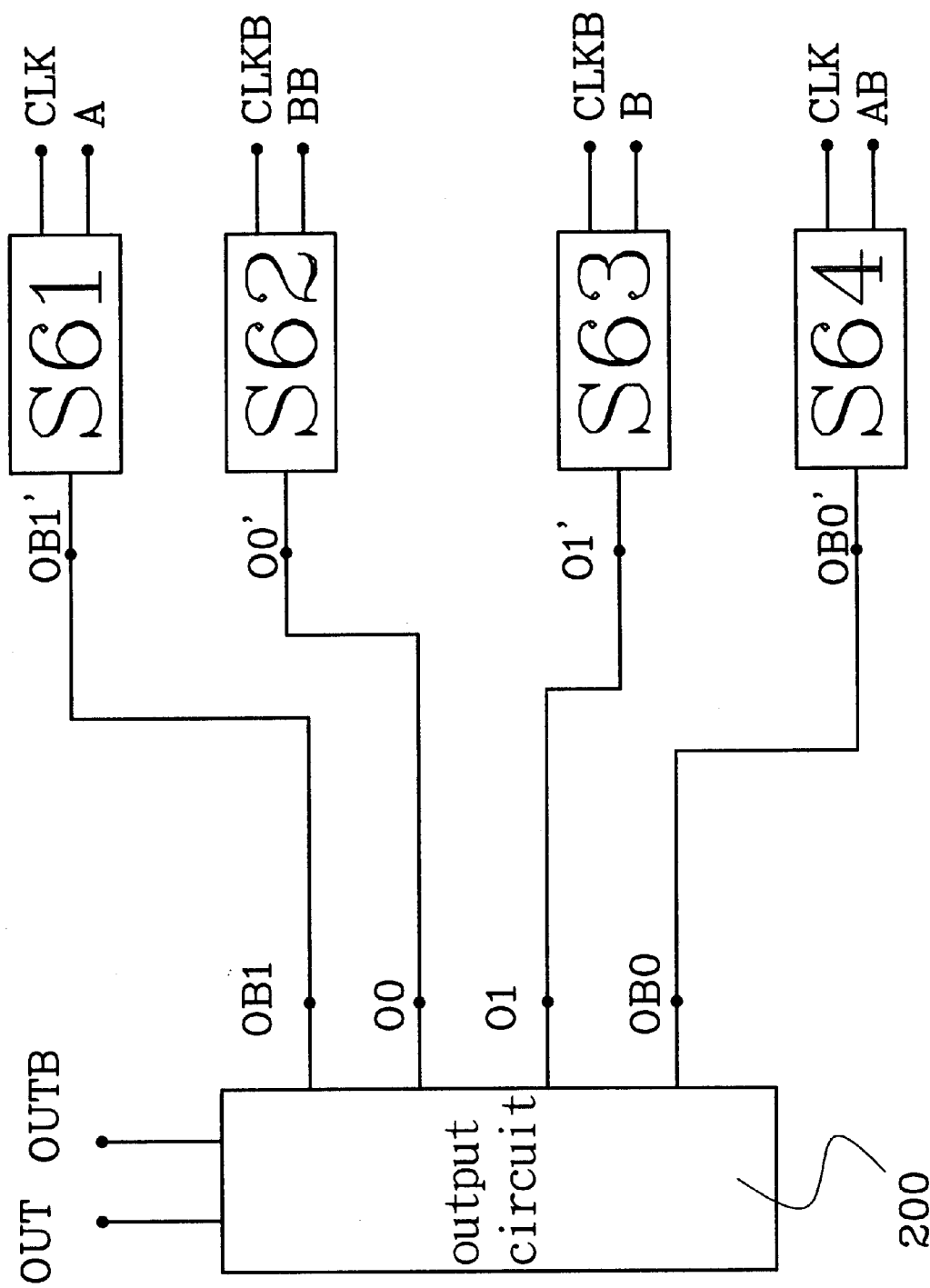
FIG. 6B is a schematic block diagram showing a multiplier with the input circuits connected to the output circuit in accordance with yet another embodiment of the present invention.

Also refer to FIG. 6B, which is a schematic block diagram showing a multiplier with the input circuits connected to the output circuit in accordance with yet another embodiment of the present invention. As shown in FIG. 6B, the first input terminal OB1 of the output circuit 200 is connected to the first signal output terminal OB1' of the first stage input circuit S61. The first stage input circuit S61 further comprises a signal is input terminal A and a first clock input terminal CLK. The second input terminal O0 of the output circuit 200 is connected to the second signal output terminal O0' of the second stage input circuit S62. The second stage input circuit S62 further comprises a signal input terminal BB and a second clock input terminal CLKB. The third input terminal O1 of the output circuit 200 is connected to the third signal output terminal O1' of the third stage input circuit S63. The third stage input circuit S63 further comprises a signal input terminal B and a second clock input terminal CLKB. The fourth input terminal OB0 of the output circuit 200 is connected to the fourth signal output terminal OB0' of the fourth stage input circuit S64. The fourth stage input circuit S64 further comprises a signal input terminal AB and a first clock input terminal CLK. Therefore, by connecting the four input circuits to the output circuit 200 is formed a multiplexer, outputting at the first output terminal a logic level OUT as a function of the sum of the product of the logic level at the input terminal A and the first clock input terminal CLK and the product of the logic level at the input terminal B and the logic level at the second clock input terminal CLKB, i.e., OUT=(CLK·A)+(CLKB·B). Furthermore, the input logic levels and the input loads seen at the first stage input circuit S61, the second stage input circuit S62, the third stage input circuit S63 and the fourth stage input circuit S64 are identical.

According to the above discussion, the present invention discloses a symmetric current mode logic with symmetric input loads as well as identical input logic levels at the input terminals so as to prevent phase error due to level adjustment and to further avoid signal surges due to current steering by parallel switching. Therefore, the present invention has been examined to be new, advantageous and applicable to the industry.

Although this invention has been disclosed and illustrated with reference to particular embodiments, the principles involved are susceptible for use in numerous other embodiments that will be apparent to persons skilled in the art. This invention is, therefore, to be limited only as indicated by the scope of the appended claims.

What is claimed is:

1. A symmetric current mode logic, comprising:
    an output circuit comprising a plurality of input terminals and two differential amplifiers sharing a pair of output terminals being a first output terminal and a second output terminal; and
    a plurality of input circuits functioning as a plurality of symmetric current mode logic units, each comprising a plurality of signal output terminals connected to said plurality of input terminals of said output circuit so as to form a single-level logic circuit.

2. The symmetric current mode logic as recited in claim 1, wherein said output circuit is a current mode logic.

3. The symmetric current mode logic as recited in claim 1, wherein each of said differential amplifiers comprises a plurality of transistors.

4. The symmetric current mode logic as recited in claim 1, wherein input terminals of each of said symmetric current mode logic units comprise a plurality of transistors.

5. The symmetric current mode logic as recited in claim 4, wherein said plurality of transistors share a current source with said symmetric current mode logic.

6. The symmetric current mode logic as recited in claim 1, wherein each of said symmetric current mode logic units further comprises a differential pair of transistors connected to a resistor coupled to a base of an output transistor.

7. A symmetric current mode logic, comprising:
    an output circuit comprising a plurality of input terminals and two differential amplifiers sharing a pair of output terminals being a first output terminal OUT and a second output terminal OUTB; and
    a plurality of input circuits functioning as a plurality of symmetric current mode logic units, each comprising a differential pair of transistors having signal input terminals A, B, AB and BB and connected to a resistor coupled to a terminal of an output transistor, wherein a plurality of signal output terminals are connected to said plurality of input terminals of said output circuit so as to form a single-level logic circuit;
    wherein input signals at said signal input terminals A, B, AB and BB A, B, AB and BB are employed so as to achieve XOR operation, i.e., OUT=(A·BB)+(AB·B).

8. A symmetric current mode logic, comprising:
    an output circuit comprising a plurality of input terminals and two differential amplifiers sharing a pair of output terminals being a first output terminal OUT and a second output terminal OUTB; and
    a plurality of input circuits functioning as a plurality of symmetric current mode logic units, each comprising a differential pair of transistors having signal input terminals A, B, AB and BB and connected to a resistor coupled to a terminal of an output transistor, wherein a plurality of signal output terminals are connected to said plurality of input terminals of said output circuit so as to form a single-level logic circuit;
    wherein input signals at said signal input terminals A, B, AB and BB A, B, AB and BB are employed so as to achieve AND operation, i.e., OUT=A·B.

9. A symmetric current mode logic, comprising:
    an output circuit comprising a plurality of input terminals and two differential amplifiers sharing a pair of output terminals being a first output terminal OUT and a second output terminal OUTB; and a plurality of input circuits functioning as a plurality of symmetric current mode logic units, each comprising a differential pair of transistors having signal input terminals A, B, AB and BB and connected to a resistor coupled to a terminal of an output transistor, wherein a plurality of signal output terminals are connected to said plurality of input terminals of said output circuit so as to form a single-level logic circuit;

wherein input signals at said signal input terminals A, B, AB and BB A, B, AB and BB are employed so as to achieve OR operation, i.e., OUT=A+B.

10. A symmetric current mode logic, comprising:

an output circuit comprising a plurality of input terminals and two differential amplifiers sharing a pair of output terminals being a first output terminal OUT and a second output terminal OUTB; and a plurality of input circuits functioning as a plurality of symmetric current mode logic units, each comprising a differential pair of transistors having signal input terminals A, B, AB and BB and connected to a resistor coupled to a terminal of an output transistor, wherein a plurality of signal output terminals are connected to said plurality of input terminals of said output circuit so as to form a single-level logic circuit;

wherein input signals at said signal input terminals A, B, AB and BB A, B, AB and BB and clock signals at clock signal input terminals CLK and CLKB are employed so as to achieve a multiplexer, i.e., OUT=(CLK·A)+ (CLKB·B).

* * * * *